(12) United States Patent
Bright et al.

(10) Patent No.: US 7,521,358 B2
(45) Date of Patent: Apr. 21, 2009

(54) PROCESS INTEGRATION SCHEME TO LOWER OVERALL DIELECTRIC CONSTANT IN BEOL INTERCONNECT STRUCTURES

(75) Inventors: Nicolas Bright, San Jose, CA (US); Dave Hemker, San Jose, CA (US); Fritz C. Redeker, Fremont, CA (US); Yezdi Dordi, Palo Alto, CA (US)

(73) Assignee: LAM Research Corporation, Freemont, CA (US)

( * ) Notice: Subject to any disclaimer, the term of this patent is extended or adjusted under 35 U.S.C. 154(b) by 192 days.

(21) Appl. No.: 11/732,198

(22) Filed: Apr. 2, 2007

(65) Prior Publication Data

US 2008/0150138 A1  Jun. 26, 2008

Related U.S. Application Data

(60) Provisional application No. 60/887,279, filed on Dec. 26, 2006.

(51) Int. Cl.
*H01L 21/44* (2006.01)
*H01L 21/4763* (2006.01)

(52) U.S. Cl. ............... 438/637; 438/618; 438/598; 257/E21.495

(58) Field of Classification Search ........... 257/E21.495
See application file for complete search history.

(56) References Cited

U.S. PATENT DOCUMENTS

| | | | |
|---|---|---|---|
| 6,824,612 B2 | 11/2004 | Stevens et al. | |
| 6,864,181 B2 | 3/2005 | Redeker et al. | |
| 7,297,190 B1 | 11/2007 | Dordi et al. | |
| 7,306,662 B2 | 12/2007 | Vaskelis et al. | |
| 2002/0152955 A1 | 10/2002 | Dordi et al. | |
| 2005/0208760 A1 | 9/2005 | Ryan | |
| 2005/0241763 A1 | 11/2005 | Huang et al. | |
| 2005/0284748 A1 | 12/2005 | Dordi et al. | |
| 2005/0284767 A1 | 12/2005 | Dordi et al. | |
| 2006/0108320 A1 | 5/2006 | Lazovsky et al. | |
| 2006/0134917 A1 | 6/2006 | Huang et al. | |
| 2006/0178002 A1* | 8/2006 | Kim et al. | 438/622 |
| 2006/0264033 A1* | 11/2006 | Olmen et al. | 438/637 |
| 2007/0048447 A1 | 3/2007 | Lee et al. | |
| 2007/0231993 A1* | 10/2007 | Fukasawa et al. | 438/231 |
| 2007/0261594 A1 | 11/2007 | Vaskelis et al. | |
| 2007/0264830 A1 | 11/2007 | Huang et al. | |

(Continued)

OTHER PUBLICATIONS

Kondoh et al., "Deposition of Ru Thin Films from Supercritical Carbon Dioxide Fluids", J.J. Appl. Phys. 44(7B) p. 5799-5802 (2005).

*Primary Examiner*—Walter L Lindsay, Jr.
*Assistant Examiner*—Mohsen Ahmadi
(74) *Attorney, Agent, or Firm*—Schwegman, Lundberg & Woessner, P.A.

(57) ABSTRACT

Back-End of Line (BEoL) interconnect structures, and methods for their manufacture, are provided. The structures are characterized by narrower conductive lines and reduced overall dielectric constant values. Conformal diffusion barrier layers, and selectively formed capping layers, are used to isolate the conductive lines and vias from surrounding dielectric layers in the interconnect structures. The methods of the invention employ techniques to narrow the openings in photoresist masks in order to define narrower vias. More narrow vias increase the amount of misalignment that can be tolerated between the vias and the conductive lines.

25 Claims, 6 Drawing Sheets

U.S. PATENT DOCUMENTS

2007/0292603 A1  12/2007  Dordi et al.
2007/0292604 A1  12/2007  Dordi et al.
2007/0292615 A1  12/2007  Dordi et al.

* cited by examiner

PROCESS INTEGRATION SCHEME TO LOWER OVERALL DIELECTRIC CONSTANT IN BEOL INTERCONNECT STRUCTURES

CROSS-REFERENCE TO RELATED APPLICATIONS

This application claims the benefit of U.S. Provisional Patent Application No. 60/887,279 filed on Dec. 26, 2006 and entitled "Process Integration Scheme to Lower Overall Dielectric Constant in BEoL Interconnect Structures" which is incorporated herein by reference.

BACKGROUND OF THE INVENTION

1. Field of the Invention

The present invention relates generally to the field of semiconductor devices and more particularly to Back-End of Line (BEoL) interconnect structures and methods for their fabrication.

2. Description of the Prior Art

Increased semiconductor device performance can be achieved, at least in part, through the further miniaturization of features such as transistors. Decreased feature sizes, and decreased spacings between features, allow more features to be placed in a unit area for greater device performance. Back-End of Line (BEoL) interconnect structures include conductive lines that connect to the features. As feature densities increase, the widths of the conductive lines, and the spacings between the conductive lines also need to scale smaller.

One problem that is encountered as the conductive lines within BEoL interconnect structures are made more narrow pertains to the positioning of vias relative to those conductive lines. Ideally, each via "lands" on a conductive line. However, if vias and conductive lines are sufficiently misaligned, vias will land on the dielectric material between the conductive lines and therefore fail to connect to conductive lines. If a via lands partially on a conductive line, and partially on the dielectric material, although an electrical connection is made between the conductive line and the via, copper can deleteriously diffuse from the via into the dielectric material. Additionally, the reduced area of the electrical connection becomes an area of higher current density which accelerates void formation in the via and can lead to failures and reduced yields. Accordingly, as the conductive lines are made more narrow, landing vias on the conductive lines requires greater alignment precision.

Also, as conductive lines within BEoL interconnect structures are made more narrow, the overall dielectric constant of the interconnect structure needs to be reduced. The overall dielectric constant is an average, however, over the many dielectric layers in the interconnect structure. Some of these dielectric layers, though thin, are characterized by undesirably large dielectric constants that raise the overall dielectric constant.

What is desired, therefore, are methods for aligning vias with more narrow conductive lines in BEoL interconnect structures, and BEoL interconnect structures characterized by lower overall dielectric constants, increased yields, and greater reliability.

SUMMARY

An exemplary method of the present invention for fabricating an interconnect structure comprises forming a conductive line, forming a first capping layer selectively over the conductive line, and forming a low-k layer over the first capping layer. In some instances, the low-k layer is formed in contact with the dielectric layer surrounding the conductive line. The method also comprises exposing the conductive line. Exposing the conductive line includes forming a mask layer having an opening over the low-k layer, narrowing the opening in the mask layer, and forming a via by extending the narrowed opening through the low-k layer at least to the first capping layer. The method further comprises forming a first diffusion barrier layer on sidewalls of the via and filling the via with a first conductive material. The conductive line and first conductive material can include copper, for example. The method can further comprise forming a second capping layer selectively over the via. In some embodiments, forming the first diffusion barrier layer can include atomic layer deposition of ruthenium or tantalum, supercritical $CO_2$ deposition of ruthenium or tantalum, or depositing a metal by a method selected from the group consisting of chemical vapor deposition, plasma-enhanced chemical vapor deposition, and plasma-enhanced atomic layer deposition.

In some embodiments, forming the conductive line includes forming a dielectric layer, defining a first trench in the dielectric layer, and filling the first trench with a second conductive material, which can also be copper. Here, forming the dielectric layer can comprise depositing an organosilicate glass. Forming the conductive line can also include forming a second diffusion barrier layer within the first trench.

The method can further include forming a dielectric barrier layer over the dielectric layer and over the first capping layer. Here, forming the via includes extending the narrowed opening through the dielectric barrier layer. In those embodiments that include forming the dielectric barrier layer over the dielectric layer, forming the dielectric barrier layer can comprise depositing silicon carbide, silicon nitride, or silicon carbon nitride.

In various embodiments, forming the first capping layer includes electroless plating of cobalt or a cobalt-alloy, forming the low-k layer includes depositing an organosilicate glass, and forming the mask layer includes depositing a photoresist layer and forming the opening in the photoresist layer. In some of these latter embodiments, forming the mask layer includes forming a hard mask layer before forming the photoresist layer. Narrowing the opening, in some embodiments, includes forming a conformal deposition layer on sidewalls of the opening. In some of these embodiments, forming the conformal deposition layer includes cycling between deposition and etching. Forming the via can include extending the narrowed opening through the first capping layer to the conductive line, in some embodiments.

After forming the via and before forming the first diffusion barrier layer, in some embodiments the method further comprises forming a second trench in the low-k layer, where the trench is aligned with the via. Here, forming the first diffusion barrier layer on sidewalls of the via can include forming the first diffusion barrier layer on sidewalls of the second trench. Also, filling the via with the second conductive material can include filling the second trench with copper.

An exemplary interconnect structure of the present invention comprises a conductive line, a first dielectric layer disposed over the conductive line, and a first capping layer disposed between the first dielectric layer and the conductive line and disposed selectively over the conductive line. The interconnect structure also comprises a conductive via disposed through the first dielectric layer and through the first capping layer, and a diffusion barrier layer disposed between the conductive via and the first dielectric layer. In some embodiments, a critical dimension of the conductive line is no more than 60 nm. In various embodiments, the first capping layer comprises cobalt, and the diffusion barrier layer comprises ruthenium or tantalum.

In some embodiments, the interconnect structure further comprises a dielectric barrier layer disposed over the first dielectric layer, and the conductive via is disposed through the dielectric barrier layer. The interconnect structure can also comprise a second capping layer disposed over the conductive via. The interconnect structure further comprises, in some embodiments, a second dielectric layer disposed around the conductive line, and in some of these embodiments the interconnect structure further comprises a dielectric barrier layer disposed between the first and second dielectric layers.

Another exemplary interconnect structure of the present invention comprises a first conductive line disposed within a first dielectric layer, a second dielectric layer disposed over the first conductive line and contacting the first dielectric layer, and a first capping layer disposed between the second dielectric layer and the first conductive line. The interconnect structure also comprises a conductive via disposed through the second dielectric layer and at least to the first capping layer, and a first diffusion barrier layer disposed between the conductive via and the second dielectric layer. The interconnect structure further comprises, in some instances, a second diffusion barrier layer disposed between the first conductive line and the first dielectric layer. The first diffusion barrier layer can comprise ruthenium or tantalum, in some embodiments.

In some embodiments, the interconnect structure further comprising a second conductive line disposed within the second dielectric layer, wherein the conductive via contacts the second conductive line. Here, the interconnect structure can further comprise a second capping layer disposed selectively over the second conductive line. In some instances the conductive via is disposed through the first capping layer and to the first conductive line.

Still another exemplary method of fabricating an interconnect structure comprises forming a first conductive line in a dielectric layer, forming a first capping layer selectively over the first conductive line, and forming a low-k layer over the first capping layer and in contact with the dielectric layer. The method further comprises exposing the conductive line including forming a mask layer having an opening over the low-k layer, narrowing the opening in the mask layer, and forming a via by extending the narrowed opening through the low-k layer and at least to the first capping layer. The method further comprises forming a first diffusion barrier layer on sidewalls of the via, and filling the via with a first conductive material. In some embodiments, extending the narrowed opening at least to the first capping layer includes extending the narrowed opening through the first capping layer and to the first conductive line. Forming the first conductive line in the dielectric layer can include forming a second diffusion barrier layer in the dielectric layer. The method can also comprise forming a second conductive line in the low-k layer. In some of these embodiments, the method can further comprise forming a second capping layer selectively over the second conductive line.

BRIEF DESCRIPTION OF DRAWINGS

FIGS. 1-9A are cross-sectional views of an interconnect structure at successive stages of manufacture, according to an exemplary embodiment of the invention.

DETAILED DESCRIPTION OF THE INVENTION

The present invention provides methods for forming Back-End of Line (BEoL) interconnect structures characterized by reduced overall dielectric constant values. Reductions in the dielectric constant are achieved, for example, through the elimination of dielectric barrier layers with high dielectric constants and/or the substitution of thinner diffusion barrier layers. The methods of the invention employ conformal diffusion barrier layers and selectively formed capping layers to isolate conductive lines and vias from surrounding dielectric layers. The methods of the invention also employ techniques to narrow openings in photoresist masks to define narrower vias. Employing more narrow vias increases the amount of misalignment that can be tolerated in the registration of the masks used to form the openings. The increased tolerance allows, in turn, for narrower conductive lines and thus for increased routing densities.

Figure 1:
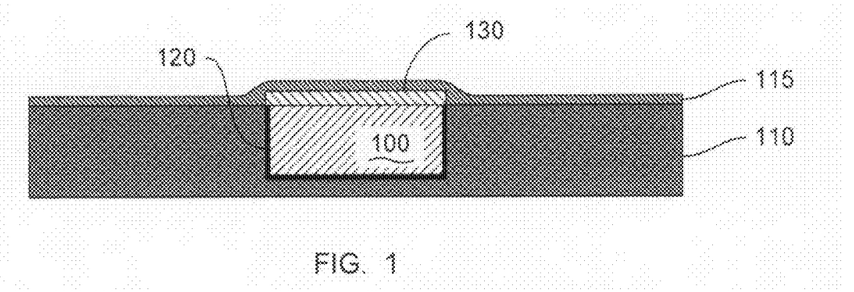

FIG. 1 provides a cross-sectional view of a conductive line 100 isolated from adjacent lines (not shown) by a dielectric layer 110. In some embodiments the conductive line 100 comprises copper. The dielectric layer 110 can comprise $SiO_2$, for example. The dielectric layer 110 can also comprise a low dielectric constant ("low-k") material, one that has a dielectric constant less than that of $SiO_2$. Such low-k materials, especially those with dielectric constants lower than 3, are increasingly favored in semiconductor device fabrication as they impart superior electrical properties to the finished devices. Examples of suitable low-k materials include fluorosilicate glass (FSG), organosilicate glass (OSG), and highly porous $SiO_2$. One example of an organosilicate glass is a carbon-doped oxide film such as Black Diamond (BD) level 1.

In some embodiments, the topmost portion of the dielectric layer 110 can comprise a more durable material (not shown) that serves to protect the dielectric layer 110 during subsequent operations such as planarization that can place stresses on the dielectric layer 110. The more durable material for this topmost portion can be formed by deposition, in some instances. In other instances, the more durable material is formed by altering the growth conditions during the latter stage of forming the dielectric layer 110. In this way the dielectric layer 110 comprises a continuous film where the topmost portion has a different microstructure than the bulk of the dielectric layer 110. For example, as an organosilicate glass is grown to form the dielectric layer 110, the growth conditions can be modified to alter the microstructure of the growing organosilicate glass in order to form the topmost portion. Here, the topmost portion can have an increased density or different composition, for instance, as compared to the bulk of the dielectric layer 110. The modified microstructure provides the topmost portion with greater structural integrity than the bulk of the dielectric layer 110.

The conductive line 100 can be formed by defining a trench into the dielectric layer 110, such as by conventional lithographic masking and etching processes, followed by filling the trench with copper (Cu). In some embodiments, filling the trench with copper is preceded by forming a diffusion barrier layer 120 within the trench. The diffusion barrier layer 120 serves as a barrier to deleterious copper diffusion from the conductive line 100 into the dielectric layer 110. In some embodiments, the conductive line 100 is formed by electroless plating, and in these embodiments the diffusion barrier layer 120 also provides a conductive coating on which to plate copper. Methods for electroless plating are taught, for example in U.S. patent application Ser. No. 11/643,404 filed on Dec. 20, 2006 and entitled "Self-Limiting Plating Method," U.S. patent application Ser. No. 11/382,906 filed on May 25, 2006 and entitled "Plating Solution for Electroless Deposition of Copper," U.S. patent application Ser. No. 11/427,266 filed on Jun. 28, 2006 and entitled "Plating Solutions for Electroless Deposition of Copper," U.S. patent application Ser. No. 11/514,038 filed on Aug. 30, 2006 and entitled "Processes and Systems for Engineering a Barrier Surface for Copper Deposition," U.S. patent application Ser. No. 11/639,752 filed on Dec. 15, 2006 and entitled "Controlled Ambient System for Interface Engineering," and U.S. patent application Ser. No. 11/644,697 filed on Dec. 22, 2006 and entitled "Electroless Deposition of Cobalt Alloys," each of which is incorporated herein by reference.

Examples of suitable materials for the diffusion barrier layer 120 include ruthenium (Ru), tantalum (Ta), and tantalum nitride (TaN) and can be deposited on the sidewalls and bottom surface of the trench through techniques such as physical vapor deposition (PVD), atomic layer deposition (ALD), supercritical $CO_2$ (SCCO2) deposition, chemical vapor deposition (CVD), plasma-enhanced chemical vapor deposition (PECVD), or plasma-enhanced atomic layer deposition (PEALD). In some embodiments, the diffusion barrier layer 120 comprises a plurality of sub-layers ending with a seed layer of copper, tantalum, or ruthenium, for example, as a topmost layer for seeding the subsequent copper deposition to fill the trench. A suitable technique for depositing the seed layer is PVD. In some instances, after the diffusion barrier layer 120 is formed, the diffusion barrier layer 120 is treated with a hydrogen containing plasma to remove contaminants and/or decomposed metal oxides, as also described in U.S. patent application Ser. No. 11/514,038. An exemplary diffusion barrier layer 120 comprises a tantalum nitride sub-layer contacting the dielectric layer 10, a tantalum sub-layer disposed over the tantalum nitride sub-layer, and a copper seed sub-layer disposed over the tantalum sub-layer, each deposited by PVD.

One technique for forming the diffusion barrier layer 120, or a sub-layer thereof, includes forming a film that varies in composition from tantalum nitride (TaN) to tantalum as a function of thickness. Here, tantalum nitride is initially formed by PVD on the surfaces of the trench by introducing both tantalum and nitrogen into a deposition chamber. Next, the supply of nitrogen is removed so that a composition gradient forms in the growing film as the available nitrogen in the deposition chamber is depleted. The film is completed in the absence of nitrogen, producing a tantalum surface. Methods for forming a TaN/Ta film are taught, for example in U.S. patent application Ser. No. 11/513,446 filed on Aug. 30, 2006 and entitled "Processes and Systems for Engineering a Silicon-Type Surface for Selective Metal Deposition to Form a Metal Silicide," incorporated herein by reference.

Once the conductive line 100 has been formed, for example by electroless plating of copper, a capping layer 130 is selectively formed over the conductive line 100, as seen in FIG. 1. In some embodiments, the capping layer 130 includes cobalt (Co) or a cobalt alloy such as cobalt tungsten phosphide (CoWP), cobalt tungsten boride (CoWB), or cobalt tungsten borophosphide (CoWBP). By employing electroless plating, the capping layer 130 forms selectively on the conductive line 100. Electroless plating of cobalt alloys is taught, for instance, in U.S. patent application Ser. Nos. 11/644,697, noted above, and 11/513,634 filed on Aug. 30, 2006 and entitled "Processes and Systems for Engineering a Copper Surface for Selective Metal Deposition" both incorporated herein by reference.

Some embodiments include an optional dielectric barrier layer 115 disposed over the dielectric layer 110 and over the capping layer 130. Other embodiments omit the dielectric barrier layer 115 to achieve a lower overall dielectric constant. The dielectric barrier layer 115 can be formed by various deposition techniques. Suitable materials for the dielectric barrier layer 115 include silicon carbide (SiC), silicon nitride ($Si_3N_4$), and silicon carbon nitride (SiCN).

Figure 2:
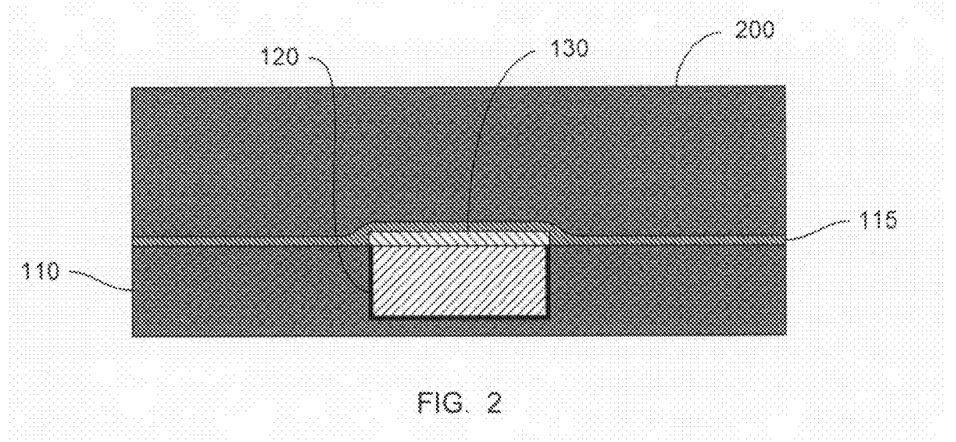

As shown in FIG. 2, a low-k layer 200 is formed over the dielectric barrier layer 115. In those embodiments that do not include the optional dielectric barrier layer 115, the low-k layer 200 is formed over the capping layer 130 and in contact with the dielectric layer 110. It can be seen from FIG. 2 that the diffusion barrier layer 120 and the capping layer 130 prevent copper diffusion into the low-k layer 200 and the dielectric layer 110. In addition to the low-k materials described above with respect to the dielectric layer 110, the low-k layer 200 can also be formed from Black Diamond.

Also, as with the dielectric layer 110, the low-k layer 200 can include an optional more durable topmost portion (not shown). This topmost portion can be grown with a modified microstructure as described above, for example. Similarly, as with the dielectric barrier layer 115, a further dielectric barrier layer (not shown) of silicon carbide, silicon nitride, or silicon carbon nitride can be provided on top of the low-k layer 200.

Figure 3:
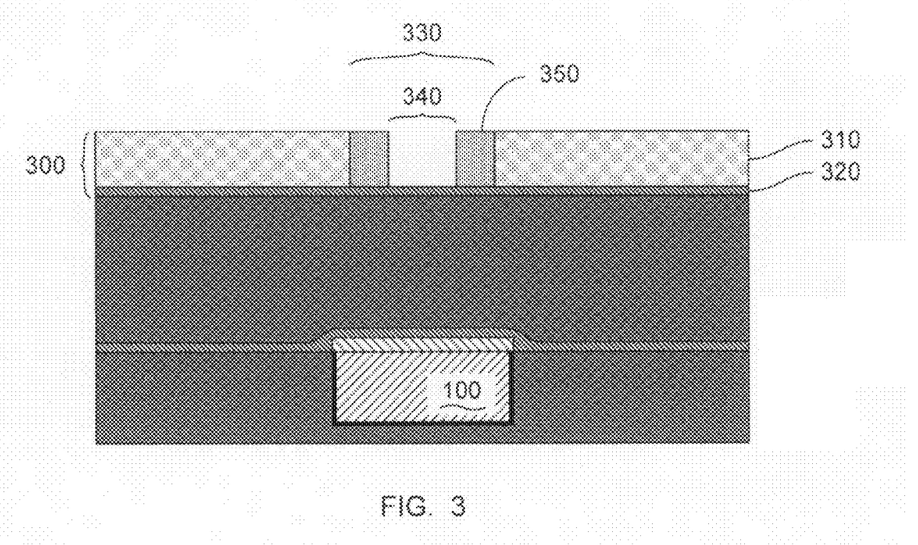

In FIG. 3 the low-k layer 200 is masked with a mask layer 300 to begin a process of exposing the conductive line 100. The mask layer 300 can include a photoresist layer 310 and an optional hard mask layer 320 between the photoresist layer 310 and the low-k layer 200. In those embodiments where the low-k layer 200 is covered by a dielectric barrier layer, this dielectric barrier layer can also serve as the hard mask layer 320.

The mask layer 300 includes an opening 330, aligned with the conductive line 100, formed in the photoresist layer 310. In order to compensate for misalignment error in the location of the opening 330, the opening 330 is narrowed to form a narrowed opening 340. Narrowing openings in masks is sometimes referred to as mask shrinking or next generation patterning (NGP). Mask shrinking can be achieved, for example, by forming a conformal deposition layer 350 on the sidewalls of the opening 330 through cyclical processes that alternate between deposition and etching. Suitable mask shrinking techniques are described in U.S. patent application Ser. No. 11/016,455 filed on Dec. 16, 2004 and entitled "Reduction of Etch Mask Feature Critical Dimensions," U.S. patent application Ser. No. 11/432,194 filed on May 10, 2006 and entitled "Pitch Reduction," and U.S. patent application Ser. No. 10/835,175 filed on Apr. 30, 2004 and entitled "Gas Distribution System having Fast Gas Switching Capabilities," each of which is incorporated herein by reference.

Figure 4:
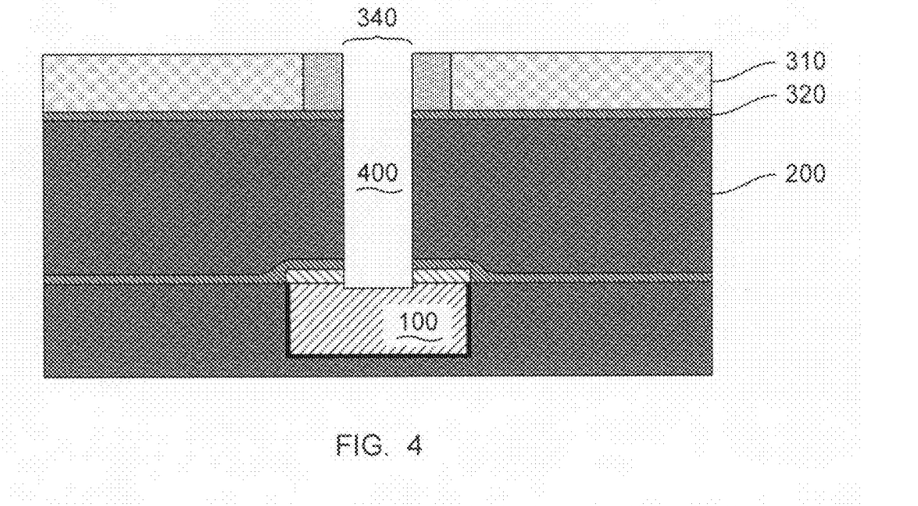
Figure 5:
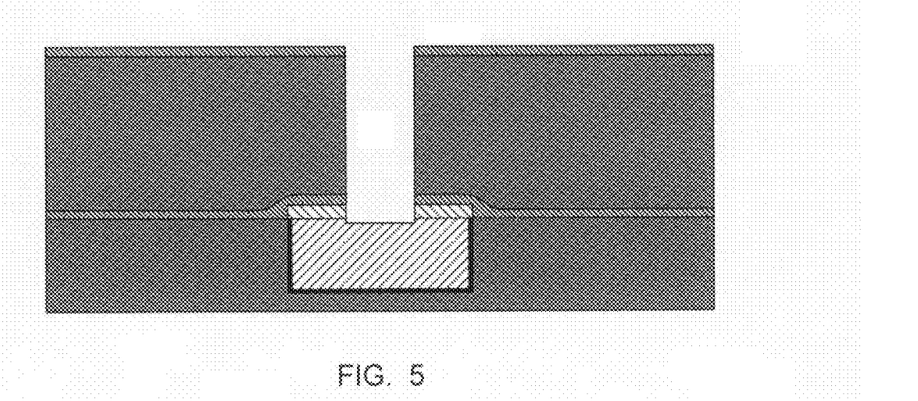

As shown in FIG. 4, exposing the conductive line 100 further comprises forming a via 400 by extending the narrowed opening 340 through the hard mask layer 320, if present, through the low-k layer 200, through the dielectric barrier layer 115 if present, and through the capping layer 130 to the conductive line 100, for example, by etching. Here, the conductive line 100 can serve as an etch stop. It will be appreciated that exposing the conductive line 100 can also be achieved by extending the narrowed opening 340 just to the capping layer 130, but not completely through the capping layer 130. Here, the capping layer 130 can serve as an etch stop. Although the conductive line 100 is not uncovered in these embodiments, because the capping layer 130 is itself electrically conductive, the conductive line 100 is electrically exposed when the narrowed opening 340 reaches the capping layer 130. After the via 400 has been formed, the photoresist layer 310 can be stripped, as shown in FIG. 5. This can include a wafer cleaning process such as an oxygen plasma ash, in some embodiments.

Figure 6:
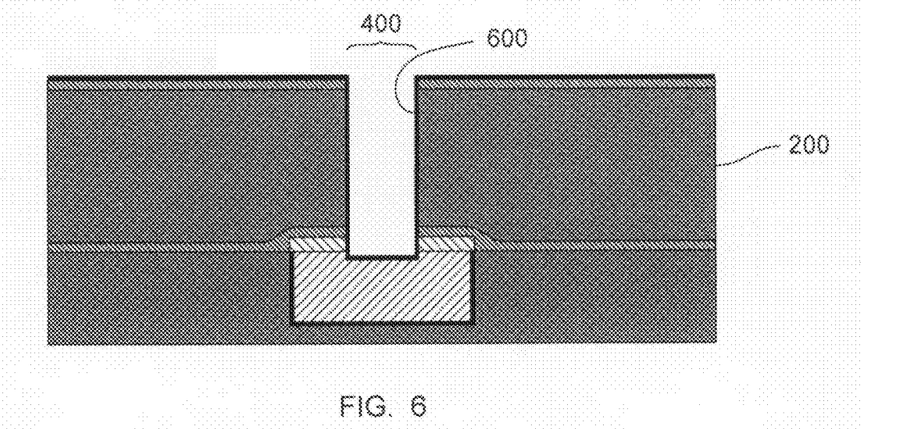

As can be seen in FIG. 6, after the conductive line 100 has been exposed, a diffusion barrier layer 600 is formed conformally on the sidewalls of the via 400 and across a top surface of the hard mask layer 320, if present. In the absence of the hard mask layer 320, the diffusion barrier layer 600 is formed across a top surface of the low-k layer 200. Suitable materials and deposition methods for the diffusion barrier layer 600 have been described above with respect to the diffusion barrier layer 120.

It should be noted that although the sidewalls of the via 400 are shown as parallel herein, etching can create a via 400 that has a slightly tapered shape that decreases in width towards the conductive line 100. The width of the via 400 as measured at the interface with the conductive line 100 can be no greater than 130 nanometers (nm), 100 nm, 80 nm, 65 nm, 50 nm, or 32 nm, in various embodiments.

Figure 7:
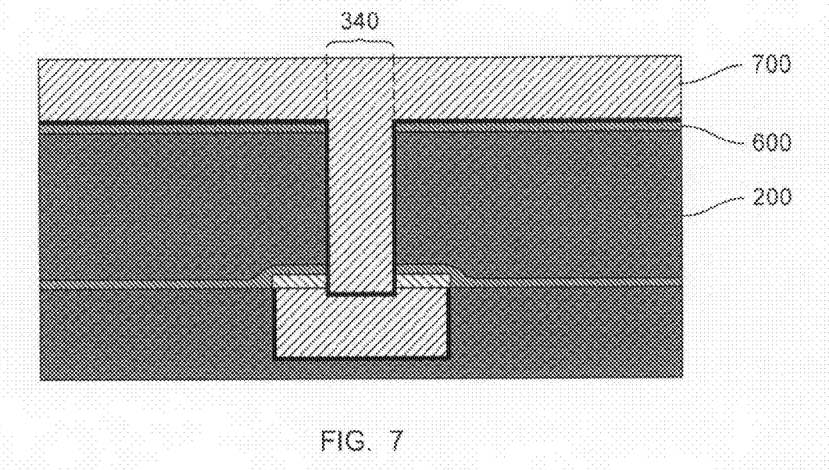
Figure 8:
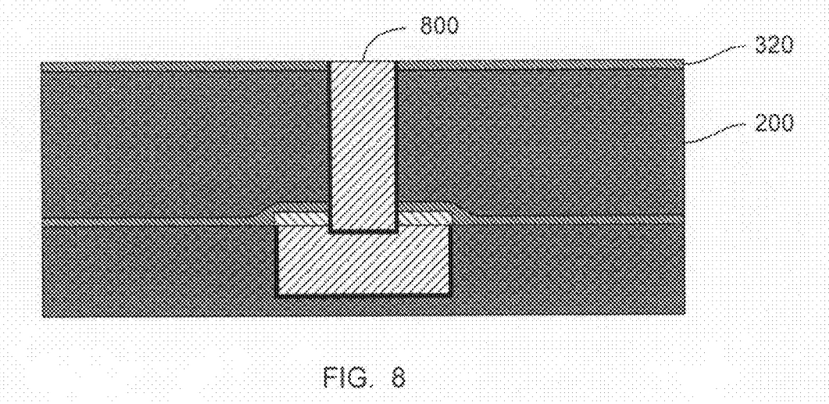
Figure 9A:
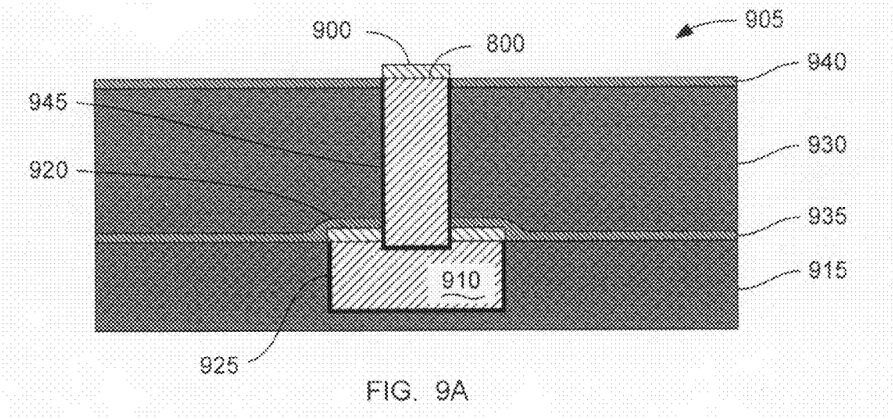

FIGS. 7-9A illustrate an exemplary process for filling the via 400 with a conductive material such as copper. In FIG. 7 a copper layer 700 is formed within the via 400 and over the low-k layer 200. The copper layer can be formed by first electroless plating copper onto the diffusion barrier layer 600 followed by electroplating copper as described, for example, in U.S. patent application Ser. Nos. 11/514,038, 11/382,906, and 11/427,266, each noted above. As shown in FIG. 8, the copper layer 700 can be planarized back to the hard mask layer 320, if present, or to the low-k layer 200 otherwise. Chemical Mechanical Polishing (CMP) can be used, for example, to planarize the copper layer 700. Planarization leaves a copper plug 800 within the via 400 and also serves to remove the diffusion barrier layer 600 between adjacent copper lines 100 to electrically isolate the copper lines 100. Next, as seen in FIG. 9A, a capping layer 900 is selectively formed over the copper plug 800. The capping layer 900 can be formed by the materials and methods described above with respect to capping layer 130. Further dielectric layers (not shown) can be formed over the capping layer 900.

It will be appreciated that by narrowing the opening 330 to form the via 400, less precision is required in positioning the opening 330 over the conductive line 100. Put another way, as the via 400 is made more narrow, the resulting copper plug 800 can be further misaligned with respect to the conductive line 100 and still land on the capping layer 130. For a conductive line 100 with a critical dimension (e.g., the width of the conductive line 100 in FIG. 1) of 60 nm and a copper plug 800 with a critical dimension of 34 nm, the placement of the opening 330 can vary laterally by as much as 13 nm in either direction. Being able to land the via 400 completely on conductive line 100 allows for the elimination of the dielectric barrier layer 115 from some embodiments.

FIG. 9A also serves to illustrate an exemplary interconnect structure 905 of the present invention. The interconnect structure 905 comprises a conductive line 910, for example, of copper, isolated from adjacent copper lines (not shown) by a dielectric layer 915. In some instances the conductive line 910 has a critical dimension of no more than 60 nm. The dielectric layer 915 can comprise a low-k material, in some embodiments. The interconnect structure 905 also comprises a capping layer 920 disposed over the conductive line 910. Suitable materials for the capping layer 920 include cobalt and cobalt alloys described above. Some embodiments of the interconnect structure 905 comprise a diffusion barrier layer 925 between the conductive line 910 and the dielectric layer 915. In some embodiments, the diffusion barrier layer 925 comprises tantalum nitride, tantalum, ruthenium, copper, alloys thereof, or sub-layers thereof.

The interconnect structure 905 further comprises a dielectric layer 930 disposed over the dielectric layer 915. The dielectric layer 930 can also comprise a low-k material, in some embodiments. In some instances, a dielectric barrier layer 935 is disposed between the dielectric layers 915, 930. The dielectric barrier layer 935 can comprise silicon carbide, silicon nitride, or silicon carbide nitride, for example. The interconnect structure 905 can optionally also comprise a dielectric barrier layer 940 disposed over the dielectric layer 930. Suitable materials for the dielectric barrier layer 940 also include silicon carbide, silicon nitride, and silicon carbon nitride.

The interconnect structure 905 further comprises a conductive via (also referred to in the example herein as copper plug 800) disposed through the dielectric layer 930 and through the capping layer 920. In embodiments that include the dielectric barrier layer 940, the conductive via is also disposed through the dielectric barrier layer 940. The conductive via can comprise a conductive material such as copper, and in some embodiments comprises the same material as the conductive line 910. The interconnect structure 905 also comprises a capping layer (also referred to herein as capping layer 900) disposed over the conductive via.

Some embodiments of the interconnect structure 905 also comprise a diffusion barrier layer 945 between the conductive via and the dielectric layer 930. The diffusion barrier layer 945 can also be disposed between the conductive via and the conductive line 910. In some embodiments, the diffusion barrier layer 945 comprises tantalum nitride, tantalum, ruthenium, copper, alloys thereof, or multiple layers thereof.

Figure 9B:
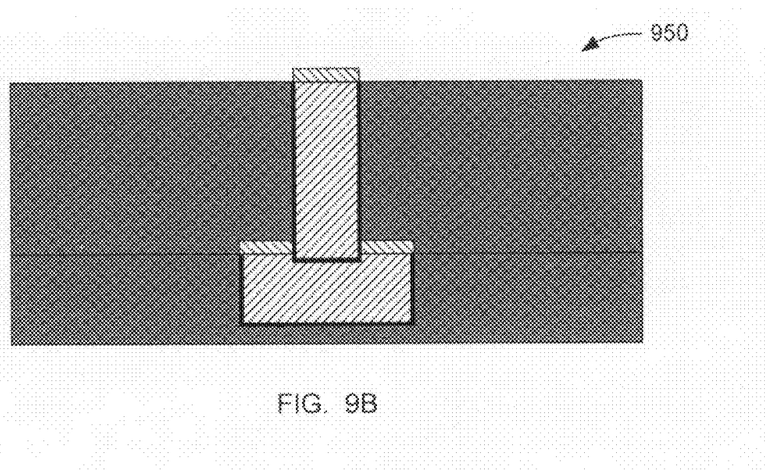
FIG. 9B is a cross-sectional view of an interconnect structure according to another exemplary embodiment of the invention.

FIG. 9B illustrates another exemplary interconnect structure 950 of the present invention. In the interconnect structure 950, the dielectric barrier layers 935, 940 of interconnect structure 905 (FIG. 9A) have been omitted, resulting in a lower overall dielectric constant. It will be appreciated that further embodiments can include only one of the dielectric barrier layers 935, 940 while omitting the other.

It will be appreciated that in the interconnect structures 905 (FIG. 9A) and 950 (FIG. 9B) the conductive via can be disposed through the capping layer 920, as illustrated, can be disposed partially through the capping layer 920, or can merely extend to the capping layer 920. Although the electrical resistance of the material of the capping layer 920 may be higher than that of the materials of the conductive via and the conductive line 910, the capping layer 920 can be sufficiently thin that the added electrical resistivity is negligible. Also, it will be understood that the diffusion barrier layer 945 in both interconnect structures 905 and 950 is preferably formed of a material with good electrical conductivity to reduce the overall via resistivity.

Figure 10:
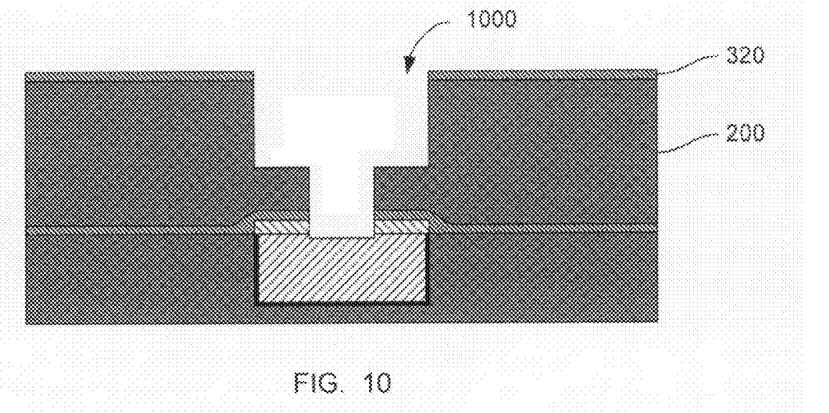
FIGS. 10-14 are cross-sectional views of an interconnect structure at successive stages of manufacture, according to another exemplary embodiment of the invention.
Figure 11:
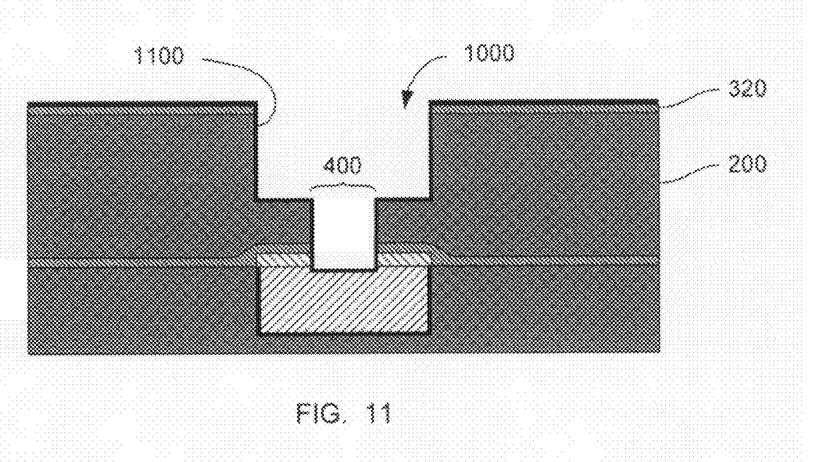

FIGS. 10-14 illustrate another exemplary method of the invention pertaining to forming a dual damascene interconnect structure. In FIG. 10, after exposing the conductive line 100 by extending the via 400 to the conductive line 100 (as in FIG. 5), the low-k layer 200 (and the hard mask layer 320, if present) is again masked and etched to form a trench 1000 that is aligned with the via 400 as can be achieved, for example, using a "via first" or "trench first" process sequence known to those skilled in the art. In FIG. 1, a diffusion barrier layer 1100 is formed on the sidewalls of the via 400, the trench 1000, and across a top surface of the hard mask layer 320, if present, or across a top surface of the low-k layer 200 otherwise. Diffusion barrier layer 1100 can be formed of the materials, and by the methods, described above with respect to the diffusion barrier layer 600.

Figure 12:
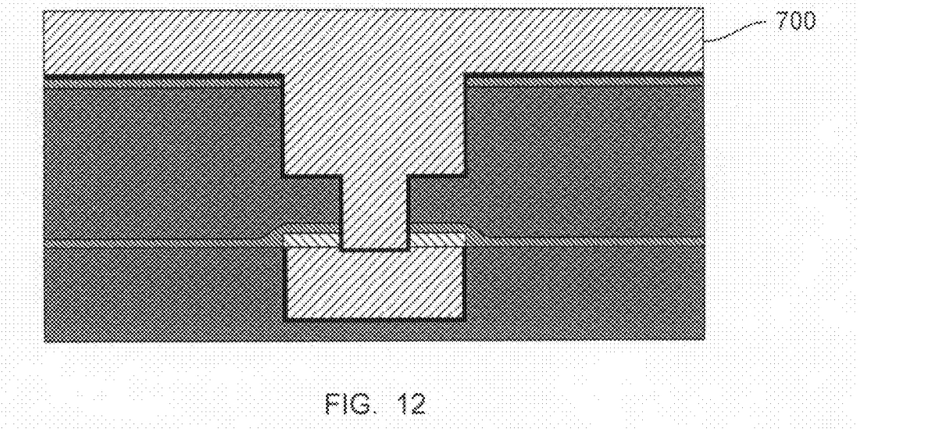
Figure 13:
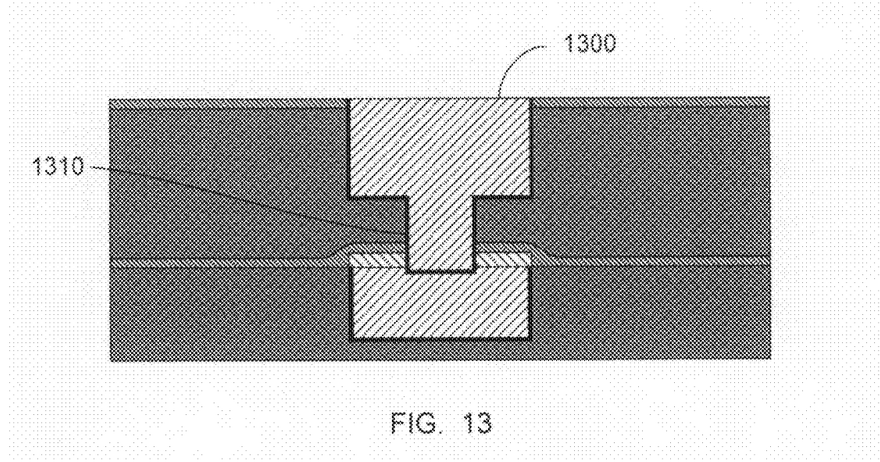
Figure 14:
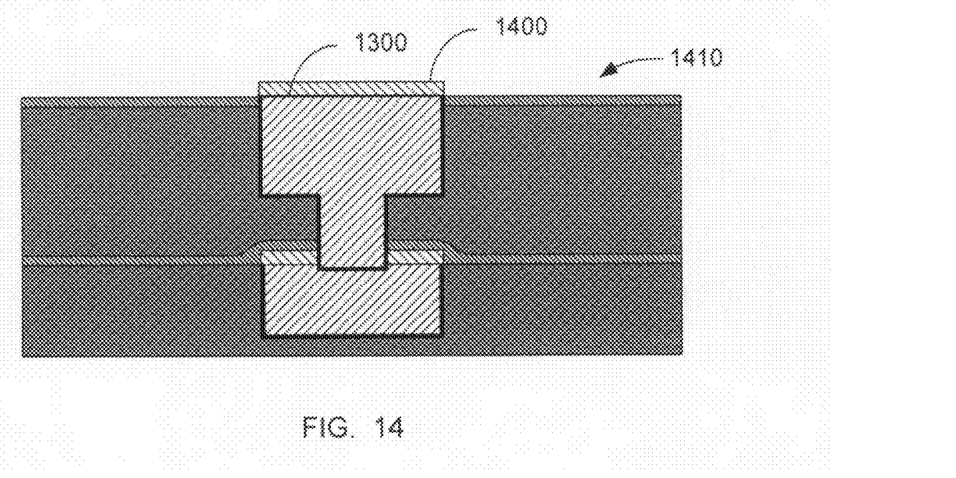

The via 400 and the trench 1000 are then filled with a copper layer 1200, as shown in FIG. 12, by the methods described above with respect to copper layer 700 (FIG. 7), for example. As shown in FIG. 13, the copper layer 1200 is planarized, removing the diffusion barrier layer 1100 between trenches 1000, for instance, by CMP, to form a conductive line 1300 and a conductive via 1310 that electrically connects the conductive line 100 to the conductive line 1300. Next, a capping layer 1400 is selectively formed over the conductive line 1300, as shown in FIG. 14. The capping layer 1400 can be formed, for example, by the materials and methods described above with respect to the capping layer 900 (FIG. 9).

Figure 15:
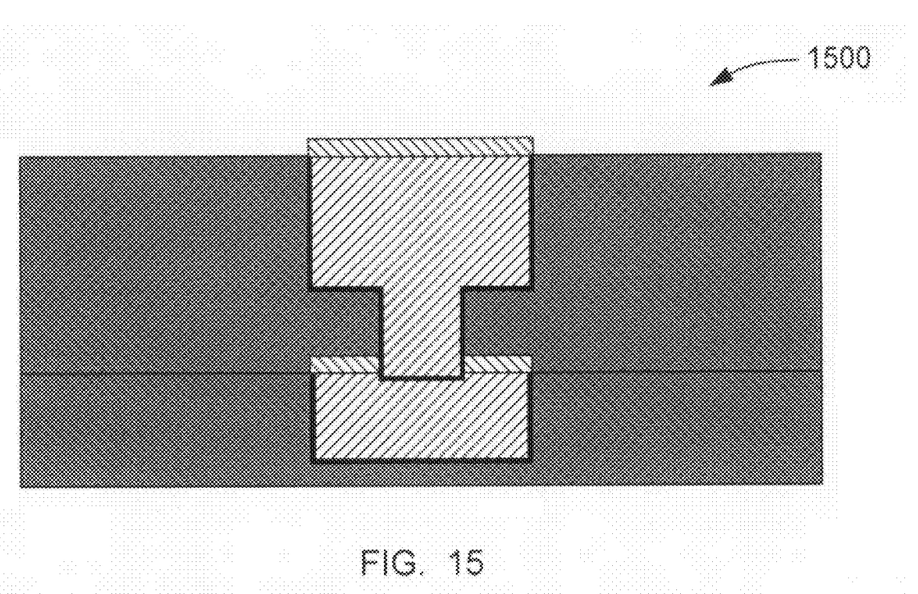
FIG. 15 is a cross-sectional view of an interconnect structure according to still another exemplary embodiment of the invention.

FIG. 14 also serves to illustrate an exemplary interconnect structure 1410 of the present invention. FIG. 15 illustrates still another exemplary interconnect structure 1500 of the present invention. In the interconnect structure 1500, the dielectric barrier layers of interconnect structure 1410 (FIG. 14) have been omitted. It will be appreciated that further embodiments can include only one of the dielectric barrier layers while omitting the other. Also, as described above with respect to FIGS. 9A and 9B, the conductive via 1310 can be disposed to the capping layer, partially through the capping layer, or completely through the capping layer over the conductive line 100.

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive.

What is claimed is:

1. A method of fabricating an interconnect structure comprising:
    forming a conductive line;
    forming a first capping layer selectively over the conductive line and a dielectric layer;
    forming a dielectric barrier layer over the dielectric layer and over the first capping layer;
    forming a low-k layer over the first capping layer;
    exposing the conductive line including
        forming a mask layer having an opening over the low-k layer,
        narrowing the opening in the mask layer, and
        forming a via by extending the narrowed opening through the low-k layer at least to the first capping layer;
    forming a first diffusion barrier layer on sidewalls of the via; and
    filling the via with a first conductive material.

2. The method of claim 1 wherein forming the conductive line includes
    forming the dielectric layer
    defining a first trench in the dielectric layer, and
    filling the first trench with a second conductive material.

3. The method of claim 2 wherein forming the dielectric layer comprises depositing an organosilicate glass.

4. The method of claim 2 wherein forming the conductive line includes forming a second diffusion barrier layer within the first trench.

5. The method of claim 1 wherein forming the dielectric barrier layer comprises depositing silicon carbide, silicon nitride, or silicon carbon nitride.

6. The method of claim 1 wherein forming the via includes extending the narrowed opening through the first capping layer to the conductive line.

7. The method of claim 1 wherein forming the first capping layer includes electroless plating of cobalt or a cobalt-alloy.

8. The method of claim 1 wherein forming the low-k layer includes depositing an organosilicate glass.

9. The method of claim 1 wherein forming the mask layer includes depositing a photoresist layer and forming the opening in the photoresist layer.

10. The method of claim 9 wherein forming the mask layer includes forming a hard mask layer before forming the photoresist layer.

11. The method of claim 1 wherein narrowing the opening includes forming a conformal deposition layer on sidewalls of the opening.

12. The method of claim 11 wherein forming the conformal deposition layer includes cycling between deposition and etching.

13. The method of claim 1 wherein forming the first diffusion barrier layer includes atomic layer deposition of ruthenium.

14. The method of claim 1 wherein forming the first diffusion barrier layer includes atomic layer deposition of tantalum.

15. The method of claim 1 wherein forming the first diffusion barrier layer includes supercritical $CO_2$ deposition of ruthenium.

16. The method of claim 1 wherein forming the first diffusion barrier layer includes supercritical $CO_2$ deposition of tantalum.

17. The method of claim 1 wherein forming the first diffusion barrier layer includes depositing a metal by a method selected from the group consisting of chemical vapor deposition, plasma-enhanced chemical vapor deposition, and plasma-enhanced atomic layer deposition.

18. The method of claim 1 further comprising, after forming the via and before forming the first diffusion barrier layer, forming a second trench in the low-k layer, the trench being aligned with the via.

19. The method of claim 18 wherein forming the first diffusion barrier layer on sidewalls of the via includes forming the first diffusion barrier layer on sidewalls of the second trench.

20. The method of claim 18 wherein filling the via with the second conductive material includes filling the second trench with copper.

21. The method of claim 1 further comprising forming a second capping layer selectively over the via.

22. A method of fabricating an interconnect structure, comprising:
    forming a first conductive line in a dielectric layer;
    forming a first capping layer selectively over the conductive line;
    forming a low-k layer over the first capping layer and in contact with the dielectric layer;
    forming a dielectric barrier layer over the dielectric layer and over the first capping layer;
    exposing the conductive line including forming a mask layer having an opening over the low-k layer, narrowing the opening in the mask layer, and forming a via by extending the narrowed opening through the low-k layer and the first capping layer and to the first conductive line;

forming a first diffusion barrier layer on sidewalls of the via; and filling the via with a first conductive material.

23. The method of claim 22 further comprising forming a second conductive line in the low-k layer.

24. The method of claim 23 further comprising forming a second capping layer selectively over the second conductive line.

25. The method of claim 22 wherein forming the first conductive line in the dielectric layer includes forming a second diffusion barrier layer in the dielectric layer.

* * * * *

UNITED STATES PATENT AND TRADEMARK OFFICE
CERTIFICATE OF CORRECTION

PATENT NO. : 7,521,358 B2  Page 1 of 1
APPLICATION NO. : 11/732198
DATED : April 21, 2009
INVENTOR(S) : Bright et al.

It is certified that error appears in the above-identified patent and that said Letters Patent is hereby corrected as shown below:

On the Title Pg Item (75), in "Inventors", line 2, delete "Dave Hemker" and insert -- David Hemker --, therefor.

On the Title Pg Item (73), in "Assignee", line 1, delete "LAM" and insert -- Lam --, therefor.

On the Title Pg Item (73), in "Assignee", line 1, delete "Freemont" and insert -- Fremont --, therefor.

On the Title Pg Item (60), under "Related U.S. Application Data", line 1, delete "60/887,279" and insert -- 60/877,279 --, therefor.

In column 1, line 9, delete "60/887,279" and insert -- 60/877,279 --, therefor.

Signed and Sealed this

Sixth Day of October, 2009

David J. Kappos
*Director of the United States Patent and Trademark Office*